US006777327B2

(12) United States Patent
Pan et al.

(10) Patent No.: US 6,777,327 B2
(45) Date of Patent: Aug. 17, 2004

(54) METHOD OF BARRIER METAL SURFACE TREATMENT PRIOR TO CU DEPOSITION TO IMPROVE ADHESION AND TRENCH FILLING CHARACTERISTICS

(75) Inventors: Wei Pan, Vancouver, WA (US);
Jer-Shen Maa, Vancouver, WA (US);
David R. Evans, Beaverton, OR (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/820,068

(22) Filed: Mar. 28, 2001

(65) Prior Publication Data

US 2002/0142590 A1 Oct. 3, 2002

(51) Int. Cl.[7] .............................................. H01L 21/44
(52) U.S. Cl. ....................... 438/653; 438/652; 438/687; 438/643
(58) Field of Search ................................. 438/680, 687, 438/643, 644, 660, 586, 653, 652, 648, 785, 622, 683, 632; 205/186; 382/148

(56) References Cited

U.S. PATENT DOCUMENTS

| | | | | |
|---|---|---|---|---|
| 5,622,608 A | * | 4/1997 | Lanford et al. | 204/192.15 |
| 5,851,367 A | * | 12/1998 | Nguyen et al. | 204/192.34 |
| 5,989,999 A | * | 11/1999 | Levine et al. | 438/627 |
| 6,177,347 B1 | * | 1/2001 | Liu et al. | 438/675 |
| 6,184,128 B1 | * | 2/2001 | Wang et al. | 438/637 |
| 6,204,179 B1 | * | 3/2001 | McTeer | 438/687 |
| 6,218,256 B1 | * | 4/2001 | Agarwal | 438/393 |
| 6,251,758 B1 | * | 6/2001 | Chern et al. | 438/582 |
| 6,291,343 B1 | * | 9/2001 | Tseng et al. | 438/653 |
| 6,303,495 B2 | * | 10/2001 | Mori et al. | 438/660 |
| 6,429,115 B1 | * | 8/2002 | Tsai et al. | 438/622 |
| 6,455,421 B1 | * | 9/2002 | Itoh et al. | 438/656 |
| 6,461,675 B2 | * | 10/2002 | Paranjpe et al. | 427/250 |

(List continued on next page.)

OTHER PUBLICATIONS

Weiss, K. Copper Seed Layers for Electroplating of Copper, Advanced Metallization Conference in 1998 (AMC 1998) 171 (1998).

(List continued on next page.)

*Primary Examiner*—Van Thu Nguyen
*Assistant Examiner*—Brad Smith
(74) *Attorney, Agent, or Firm*—David C. Ripma; Matthew D. Rabdau

(57) ABSTRACT

A rapid thermal process (RTP) provides steps wherein silicon wafers that are pre-coated with barrier metal films by either in-situ or ex-situ CVD or physical vapor deposition (PVD) are pre-treated, prior to deposition of a Cu film thereon, in a temperature range of between 250 and 550 degrees Celsius in a non-reactive gas such as hydrogen gas ($H_2$), argon (Ar), or helium (He), or in an ambient vacuum. The chamber pressure typically is between 0.1 mTorr and 20 Torr, and the RTP time typically is between 30 to 100 seconds. Performing this rapid thermal process before deposition of the Cu film results in a thin, shiny, densely nucleated, and adhesive Cu film deposited on a variety of barrier metal surfaces. The pre-treatment process eliminates variations in the deposited Cu film caused by Cu precursors and is insensitive to variation in precursor composition, volatility, and other precursor variables. Accordingly, the process disclosed herein is an enabling technology for the use of metal organic CVD (MOCVD) Cu in IC fabrication.

13 Claims, 2 Drawing Sheets

U.S. PATENT DOCUMENTS

| | | | | |
|---|---|---|---|---|
| 6,475,913 B1 | * | 11/2002 | Kim | 438/687 |
| 6,495,461 B2 | * | 12/2002 | Tsubouchi et al. | 438/683 |
| 6,509,266 B1 | * | 1/2003 | Ciotti et al. | 438/687 |
| 6,534,404 B1 | * | 3/2003 | Danek et al. | 438/680 |
| 6,548,395 B1 | * | 4/2003 | Woo et al. | 438/622 |
| 6,562,219 B2 | * | 5/2003 | Kobayashi et al. | 205/186 |
| 6,567,541 B1 | * | 5/2003 | Van et al. | 382/145 |

OTHER PUBLICATIONS

Harada, T., Surface Modification of MOCVD–TiN Film by Plasma Treatment and $SiH_4$ Exposure for Cu Interconnects, Advanced Metalization Conference in 1998 (AMC 1998) 329 (1998).

* cited by examiner

METHOD OF BARRIER METAL SURFACE TREATMENT PRIOR TO CU DEPOSITION TO IMPROVE ADHESION AND TRENCH FILLING CHARACTERISTICS

FIELD OF THE INVENTION

This invention relates to a method of treating a barrier metal surface prior to copper deposition thereon to improve the adhesion and trench filling characteristics of the copper deposition and, more particularly, to a method of pre-treating a barrier metal surface during a rapid thermal process in a vacuum or with a non-reactive gas such as hydrogen, argon or helium in a temperature range of 200 to 550 degrees Celsius, prior to the deposition of the copper film. The rapid thermal pre-treatment process improves the adhesion and trench filling characteristics of the subsequently deposited copper film.

BACKGROUND OF THE INVENTION

Two of the challenges faced in the metallization process steps of integrated circuit (IC) fabrication include achieving good adhesion of a copper (Cu) film to the underlying barrier metal layer, and achieving good gap filling characteristics of the Cu film in narrow trenches or vias. In particular, it is difficult to fill narrow trenches or vias, having a diameter of 0.13 $\mu$m or less, with copper (Cu) deposited by chemical vapor deposition (CVD), and at the same time maintain good adhesion of the Cu film to the underlying barrier metal film. Inadequate adhesion of the Cu film or uneven filling of the Cu film in the narrow trenches will result in an unusable or unreliable integrated circuit (IC) device.

In order to increase adhesion and gap filling characteristics of the Cu films, various pre-treatments and precursor compounds have been used. However, these pre-treatments and precursor compounds often result in variations in the deposited Cu film. These variations in the deposited Cu film are a severe problem which heretofore has hindered the application of CVD Cu films in IC processing.

SUMMARY OF THE INVENTION

The method of the present invention provides a rapid thermal process (RTP) wherein silicon wafers that are pre-coated with barrier metal films by either in-situ or ex-situ CVD or physical vapor deposition (PVD) are pre-treated, prior to deposition of a Cu film thereon, in a temperature range of between 300 and 550 degrees Celsius in a non-reactive gas such as hydrogen gas ($H_2$), argon (Ar), or helium (He), or in an ambient vacuum. The chamber pressure typically is between 0.1 mTorr and 20 Torr, and the RTP time typically is between 30 to 100 seconds. Performing this rapid thermal process before the deposition of the Cu film results in a thin, shiny, densely nucleated, and adhesive Cu film deposited on a variety of barrier metal surfaces. The pre-treatment process eliminates variations in the deposited Cu film caused by Cu precursors. In other words, the RTP disclosed herein is insensitive to variation in precursor composition, volatility, and other precursor variables. Accordingly, the process disclosed herein is an enabling technology for the use of metal organic CVD (MOCVD) Cu in IC fabrication.

In particular, the invention comprises a method of pre-treating a barrier metal layer of a partially finished integrated circuit device prior to the deposition of a copper film thereon, comprising the steps of: providing a partially finished integrated circuit device including a barrier metal layer; subjecting said barrier metal layer to a temperature greater than 200 degrees Celsius for at least thirty seconds to form a pre-treated barrier metal layer; and depositing a copper film on said pre-treated barrier metal layer.

The invention further comprises a method of pre-treating a barrier metal layer of a partially finished integrated circuit device for the deposition of a copper film thereon, comprising the steps of: providing a partially finished integrated circuit device including a barrier metal layer having a trench or a via therein; subjecting said barrier metal layer to a temperature greater than 200 degrees Celsius for at least thirty seconds in an atmosphere chosen from the group consisting of: an ambient vacuum, hydrogen gas, argon gas, and helium gas to form a pre-treated barrier metal layer; and thereafter depositing a copper film on said pre-treated barrier metal layer and throughout said trench.

The invention also comprises an integrated circuit device manufactured by the process of: providing a partially finished integrated circuit device including a barrier metal layer; subjecting said barrier metal layer to a temperature greater than 200 degrees Celsius for at least thirty seconds; and thereafter depositing a copper film on said barrier metal layer.

Accordingly, an object of the invention is to provide a method of pre-treating a barrier metal layer so as to improve the deposition of a Cu film thereon.

A further object of the invention is to provide a method of pre-treating a barrier metal layer so as to improve the adhesion of a Cu film thereto.

Another object of the invention is to provide a method of pre-treating a barrier metal film so as to improve the trench and via filling characteristics of Cu applied thereto.

A further object of the invention is to provide a method of reducing variations in Cu deposition caused by Cu precursors.

DETAILED DESCRIPTION OF THE PREFERRED EMBODIMENTS

Figure 1:
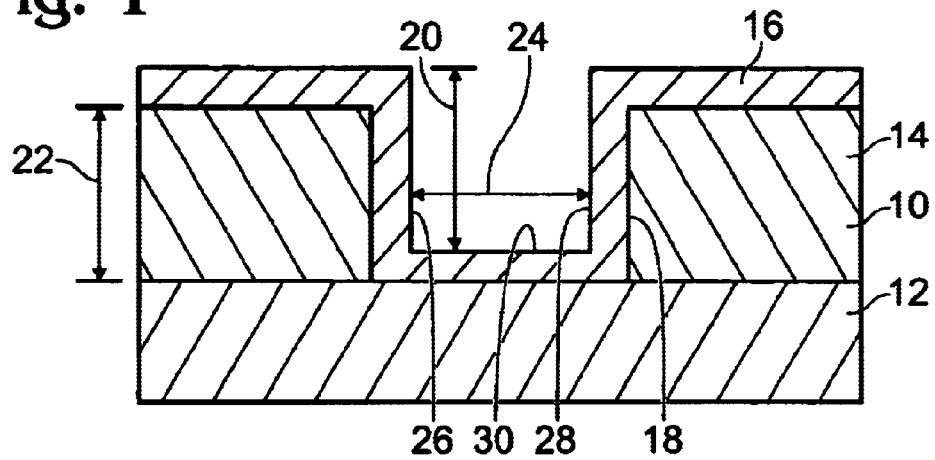
FIG. 1 is a schematic of a barrier metal layer deposited on a substrate.

Turning now to the drawings, FIG. 1 shows a partially processed integrated circuit (IC) device 10 including a substrate 12, a low dielectric constant (k) interlayer dielectric (ILD) layer 14 and a barrier metal layer 16 positioned thereon. The silicon wafers 10 typically are pre-coated with barrier metal films 16 by either in-situ or ex-situ CVD or physical vapor deposition (PVD) prior to deposition of a Cu film thereon. Barrier layer 16 may comprise titanium nitride (TiN), tantalum nitride (TaN), or other such barrier metals as known in the art. Layer 14 includes a trench or via 18 which extends through layer 14 and to substrate 12. Those skilled in the art will understand that substrate 12 may comprise any number and/or variety of layers or devices but is referred to merely as a substrate for ease of illustration. Barrier metal layer 16 is evenly deposited, or otherwise placed, completely over layer 14 and on the side walls and bottom surface of trench 18.

Trench 18, with barrier metal layer 16 extending downwardly therein, has a depth 20 similar to the thickness 22 of layer 14. For purposes of the present invention, the term trench means any type of depression or recess as known in the art, for example, a trench or a via. The trench also includes a width or diameter 24 which may be quite narrow. In particular, width 24 may be on the order of 0.13 $\mu$m or thereabout, and generally is in the range of less than 0.15 $\mu$m. Due to the narrow width of trench or via 18, a copper (Cu) film is not easily deposited on walls 26 and 28, and on bottom surface 30 of the trench. Moreover, prior art processing steps which desire to achieve good adhesion of the Cu film to the barrier metal layer, often result in poor gap filling characteristics of the Cu film in the trench or via.

Figure 2:
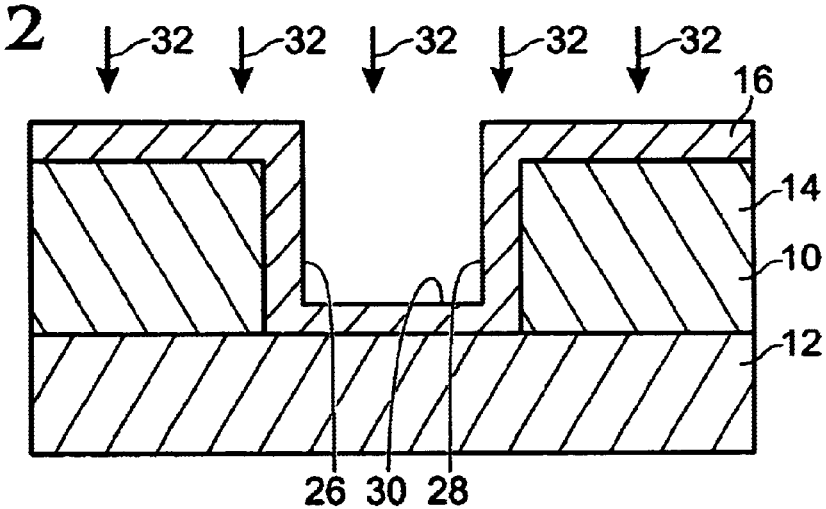
FIG. 2 is a schematic of the barrier metal layer being subjected to the pre-treatment rapid thermal process step of the present invention.

FIG. 2 shows the IC device of FIG. 1 subjected to the pre-treatment rapid thermal process step, indicated by arrows 32. Arrows 32 represent the conditions of the RTP step which include subjecting barrier metal layer 16 to a non-reactive gas such as hydrogen gas ($H_2$), argon (Ar), or helium (He), or to an ambient vacuum. The temperature range of the process typically is greater than 200 degrees Celsius, and preferably is between 250 and 550 degrees Celsius. The chamber pressure typically is between 0.1 mTorr and 20 Torr, and the RTP time typically is between 30 to 100 seconds. This pre-treatment process eliminates variations in the subsequently deposited Cu film which may be caused by Cu precursors. In other words, the RTP disclosed herein is insensitive to variations in precursor composition, volatility, and other precursor variables. After being subjected to the RTP process described above, barrier metal layer 16 is ready for the deposition of the copper film thereon.

Figure 3:
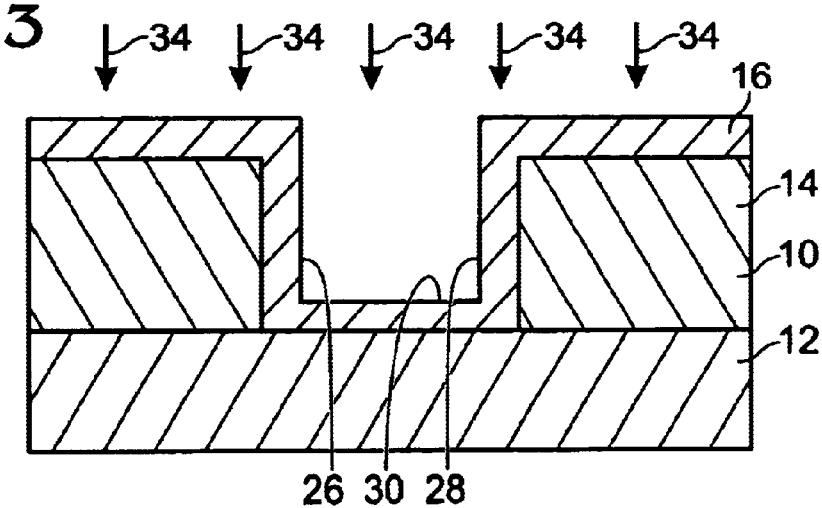
FIG. 3 is a schematic of the copper deposition step of the process of the present invention.

FIG. 3 is a schematic of the copper deposition step of the process of the present invention. The Cu deposition step is represented by arrows 34. The deposition of the Cu film may be by physical vapor deposition (PVD), chemical vapor deposition (CVD), or any other known means of placing a copper film on a barrier metal layer. In the preferred embodiment, copper deposition step 34 comprises CVD in order to achieve a uniform and thin layer of copper material on pre-treated metal barrier layer 16'. The conditions of the CVD of Cu are well known in the art and will not be discussed herein.

Figure 4:
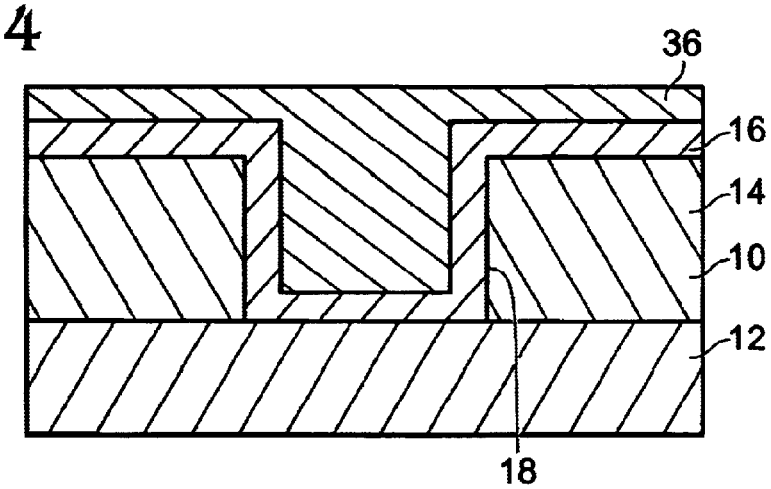
FIG. 4 is a schematic of the copper layer deposited on the barrier metal layer after the rapid thermal pre-treatment process step.

FIG. 4 is a schematic of a copper layer 36 deposited on pre-treated barrier metal layer 16' after the rapid thermal pre-treatment process step 32 described above. Performing the rapid thermal process step before the deposition of the Cu film results in a thin, shiny, densely nucleated, and adhesive Cu film 36 being deposited on a variety of barrier metal surfaces such as TiN or TaN. The copper film 36 is evenly distributed on layer 16, including throughout trench or via 18. In particular, Cu layer 36 is deposited in trench or via 18 so that the entire trench or via is filled with copper material and does not include key holes or other such variations in the copper layer. The adhesive Cu film 36 deposited on pre-treated barrier metal layer 16' withstands traditional tape tests and does not flake or peel from pre-treated barrier metal layer 16', as do the deposited Cu films of the prior art. Accordingly, the deposited Cu film has superior adhesive and trench filling characteristics compared to prior art Cu deposition processes. Moreover, the rapid thermal process step of the present invention has isotropic characteristics which is an advantage of this process in comparison to other surface treatments, such as plasma treatments. In particular, the rapid thermal process step 32 of the present invention results in better step coverage and trench fill. Accordingly, the process disclosed herein is an enabling technology for the use of metal organic CVD (MOCVD) Cu in the fabrication of IC devices.

Figure 5:
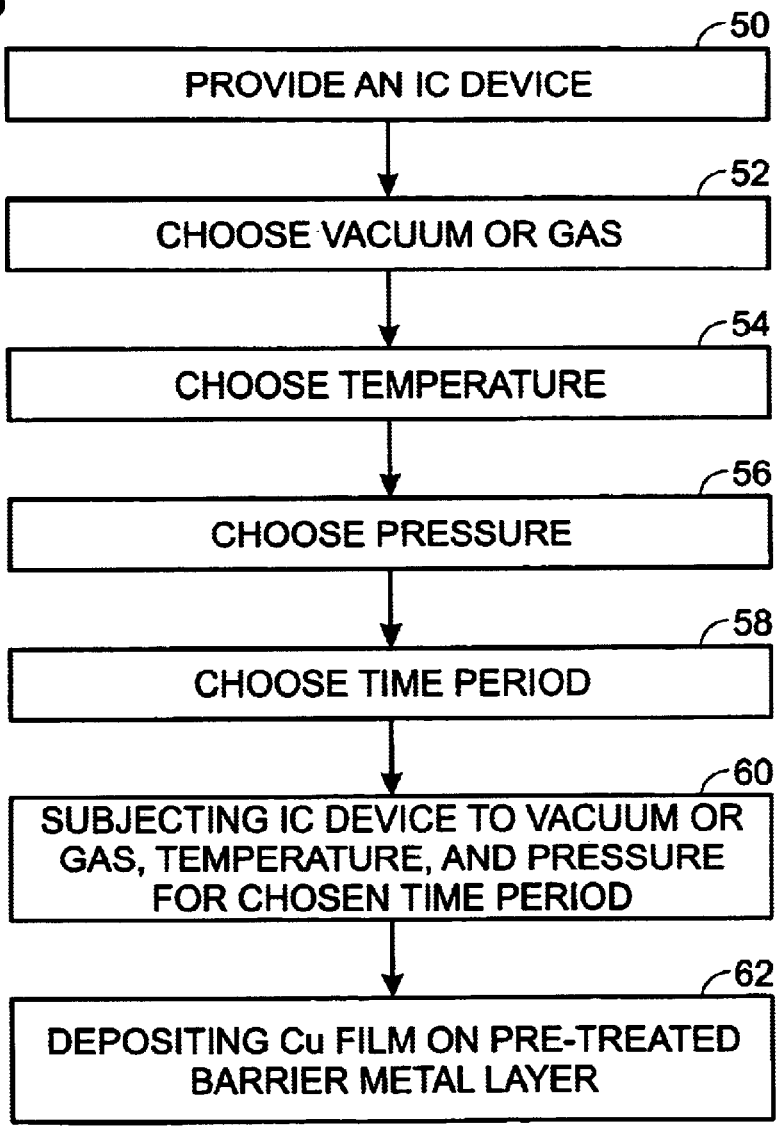
FIG. 5 is a flow diagram of the process of the present invention.

FIG. 5 is a flow diagram of the process of the present invention. Step 50 comprises providing a partially processed integrated circuit (IC) device 10 including a substrate 12, a low dielectric constant (k) interlayer dielectric (ILD) layer 14 and a barrier metal layer 16 positioned thereon, wherein layer 16 typically includes one or more trenches or vias 18. The IC device is then subjected to the pre-treatment rapid thermal process step. The first step 52 of the pre-treatment process involves choosing the gas condition that will be utilized. The conditions of step 52 include subjecting barrier metal layer 16 to a non-reactive gas such as Hydrogen gas ($H_2$), Argon (Ar), or Helium (He), or to an ambient vacuum. Step 54 includes choosing the temperature of the process, which typically is greater than 200 degrees Celsius, and preferably is between 250 and 550 degrees Celsius. Step 56 includes choosing the chamber pressure, which typically is between 0.1 mTorr and 20 Torr. Step 58 includes choosing the process time, which typically is between 30 to 100 seconds. Step 60 includes subjecting the IC device, and in particular barrier metal layer 16, to the vacuum/gas, temperature, and pressure chosen above, for the chosen time period. This pre-treatment process results in a pre-treated barrier metal layer, shown as layer 16' in FIG. 4, which is ready for the deposition of a copper film thereon. Step 62 includes depositing a copper film on pre-treated barrier layer 16' by process steps as known in the art. The deposition of the Cu film in step 62 may be by physical vapor deposition (PVD), chemical vapor deposition (CVD), or any other known means of placing a copper film on the pre-treated barrier metal layer. In a preferred embodiment, the Cu film is deposited by CVD due to its superior film application characteristics on barrier metal layers.

In a preferred embodiment, the deposition of the barrier layer on the substrate, the RTP treatment, and the deposition of the Cu film are all accomplished in-situ (without a vacuum break, but in different process chambers), thereby facilitating efficiency and cost effectiveness in the fabrication process. Of course, the steps may be undertaken ex-situ (with a vacuum break, and exposed to air), or in a combination of in-situ and ex-situ steps.

Thus, an improved IC device having a Cu film deposited thereon, and a rapid thermal pre-treatment process of manufacturing the same, has been disclosed. Although preferred structures and methods of manufacturing the device have been disclosed, it should be appreciated that further variations and modifications may be made thereto without departing from the scope of the invention as defined in the appended claims.

We claim:

1. A method of pro-treating a barrier metal layer of a partially finished integrated circuit device prior to the deposition of a copper film thereon, comprising the steps of:

providing a partially finished integrated circuit device including a barrier metal layer;

subjecting said barrier metal layer to a non-plasma atmosphere chosen from the group consisting of an ambient vacuum, hydrogen gas, argon gas and helium gas;

subjecting said barrier metal layer to a temperature greater than 200 degrees Celsius for at least thirty seconds to form a pre-treated barrier metal layer; and depositing a copper film on said pro-treated barrier metal layer.

2. The method of claim 1 wherein said step of subjecting said barrier metal layer to a temperature comprises subjecting the barrier metal layer to a temperature in a range of 250 to 550 degrees Celsius.

3. The method of claim 1, prior to depositing said copper film on said pre-treated barrier metal layer, further comprising the step of subjecting said barrier metal layer to a pressure in a range of 0.1 mTorr to 20 Torr.

4. The method of claim 1, wherein said barrier metal layer is subjected to a temperature greater than 200 degrees for 30 to 100 seconds.

5. The method of claim 1 wherein said barrier metal layer comprises a trench having a side wall, a bottom surface, and a width of 0.13□m or less, and wherein said copper film is deposited by chemical vapor deposition throughout said trench and against said side wall and said bottom surface.

6. The method of claim 1 wherein said copper film deposited on said pre-treated barrier metal layer has adhesion properties such that said copper film remains adhered to said pre-treated barrier metal layer when said copper film is subjected to a tape test.

7. The method of claim 1 wherein said barrier metal layer is chosen from the group consisting of TiN and TaN.

8. A method of pre-treating a barrier metal layer of a partially finished integrated circuit device for the deposition of a copper film thereon, comprising the steps of:

providing a partially finished integrated circuit device including a barrier metal layer having a trench therein;

subjecting said barrier metal layer to a temperature greater than 200 degrees Celsius for at least thirty seconds in a non-plasma atmosphere chosen from the group consisting of: an ambient vacuum, Hydrogen gas, Argon gas, and Helium gas to form a pre-treated barrier metal layer; and thereafter depositing a copper him on said pre-treated barrier metal layer and throughout said trench, wherein said barrier metal layer comprises TiN.

9. The method of claim 8, simultaneous to subjecting said barrier metal layer to said atmosphere, further comprising the step of subjecting said barrier metal layer to a pressure in a range of 0.1 mTorr to 20 Torr.

10. The method of claim 8 wherein said trench has a width of 0.13□m or less.

11. The method of claim 8 wherein said copper film deposited on said pro-treated barrier metal layer has adhesion properties such that said copper film remains adhered to said pre-treated barrier metal layer when said copper film is subjected to a tape test, and wherein said copper film has uniform properties there through.

12. A method of pre-treating a barrier metal layer of a partially finished integrated circuit device prior to the deposition of a copper film thereon, comprising the steps of:

providing a partially finished integrated circuit device including a barrier metal layer;

subjecting said barrier metal layer to a temperature greater than 200 degrees Celsius, while said barrier metal layer is subjected to a non-reactive atmosphere, for at least thirty seconds to form a pre-treated barrier metal layer; and depositing a copper film on said pre-treated barrier metal layer.

13. The method of claim 12 wherein said non-reactive atmosphere is chosen from the group consisting of: an ambient vacuum, hydrogen gas, argon gas and helium gas.

* * * * *